US007808418B2

(12) United States Patent
Sun et al.

(10) Patent No.: US 7,808,418 B2

(45) Date of Patent: Oct. 5, 2010

(54) HIGH-SPEED TIME-TO-DIGITAL CONVERTER

(75) Inventors: Bo Sun, Carlsbad, CA (US); Zixiang Yang, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 12/041,403

(22) Filed: Mar. 3, 2008

(65) Prior Publication Data

US 2009/0219187 A1 Sep. 3, 2009

(51) Int. Cl.
*H03M 1/50* (2006.01)

(52) U.S. Cl. .................................... 341/166; 327/269

(58) Field of Classification Search ......... 341/150-166; 327/269, 271, 272, 392, 393, 394
See application file for complete search history.

(56) References Cited

U.S. PATENT DOCUMENTS 6,429,693 B1 * 8/2002 Staszewski et al. ........... 327/12
7,045,098 B2 * 5/2006 Stephens .................... 422/102
7,205,924 B2 5/2006 Vemulapalli et al.
7,183,850 B2 * 2/2007 Pessl .......................... 330/255
7,427,940 B2 * 9/2008 Staszewski et al. ......... 341/155
2002/0005746 A1 * 1/2002 Kondo ........................ 327/278
2007/0146024 A1 * 6/2007 Allan ......................... 327/156
2007/0273569 A1 11/2007 Lin

FOREIGN PATENT DOCUMENTS

WO 0137428 5/2001

OTHER PUBLICATIONS

Levine et al: "High-resolution flash time-to-digital conversion and calibration for system-on-chip testing Embedded microelectronic systems: status and trends (Part2)" IEEE Proceedings: Computers and Digital Techniques, IEEE, GB, vol. 152, No. 3, May 6, 20.
International Search Report—PCT/US09/035908—International Search Authority—European Patent Office—Jun. 8, 2009.
Written Opinion—PCT/US09/035908—International Search Authority—European Patent Office—Jun. 8, 2009.

* cited by examiner

*Primary Examiner*—Lam T Mai
(74) *Attorney, Agent, or Firm*—Jiayu Xu

(57) ABSTRACT

Techniques for enabling a time-to-digital (TDC) to sample with sub-inverter delay resolution are disclosed. In an embodiment, the inputs to a differential D-Q flip-flop in the TDC are coupled to a single-ended signal and a delayed and inverted version of that signal to allow time interpolation of the signal. Further disclosed are techniques to balance the loads of a first delay line and a complementary delay line within the TDC.

27 Claims, 5 Drawing Sheets

HIGH-SPEED TIME-TO-DIGITAL CONVERTER

TECHNICAL FIELD

The disclosure relates to the design of time-to-digital converters (TDC's), and more specifically, to the design of TDC's having sub-unit delay resolution.

BACKGROUND

Time-to-digital converters are designed to generate a digital representation of a time interval elapsing between two events. TDC's discretize time intervals, just as analog-to-digital converters (ADC's) discretize analog signal amplitudes. The difference between an actual time interval and the discretized version of that time interval is known as the quantization error, and is determined by the TDC resolution.

TDC resolution is typically limited by the delay of a unit cell in a delay line of the TDC. For example, the delay may be the gate delay of an inverter, which is a characteristic of the particular semiconductor processing technology employed. For certain high-speed TDC applications, it would be desirable to have design techniques to improve TDC resolution to beyond the delay of a unit cell.

SUMMARY

An aspect of the present disclosure provides a time-to-digital converter comprising a delay line for generating a delayed version A(m) of a signal A, wherein A(m) is delayed relative to A by m delay units; and a sampling mechanism for sampling a difference between A(m) and a signal B[A(m)] at a time instant, wherein B[A(m)] is delayed relative to A by at least one delay unit.

Another aspect of the present disclosure provides a method for converting a time interval to a digital representation, the method comprising generating at least one delayed version A(m) of a signal A, wherein A(m) is delayed relative to A by m delay units; and sampling a difference between A(m) and a signal B[A(m)] at a time instant, wherein B[A(m)] is delayed relative to A by at least one delay unit.

Yet another aspect of the present disclosure provides a time-to-digital converter (TDC) comprising means for generating at least one delayed version A(m) of a signal A, wherein A(m) is delayed relative to A by m delay units; and means for sampling a difference between A(m) and a signal B[A(m)] at a time instant, wherein B[A(m)] is delayed relative to A by at least one delay unit.

Yet another aspect of the present disclosure provides a computer program product for converting a time interval to a digital representation, the product comprising computer-readable medium comprising code for causing a computer to generate at least one delayed version A(m) of a signal A, wherein A(m) is delayed relative to A by m delay units; and code for causing a computer to sample a difference between A(m) and a signal B[A(m)] at a time instant, wherein B[A(m)] is delayed relative to A by at least one delay unit.

DETAILED DESCRIPTION

Figure 1:
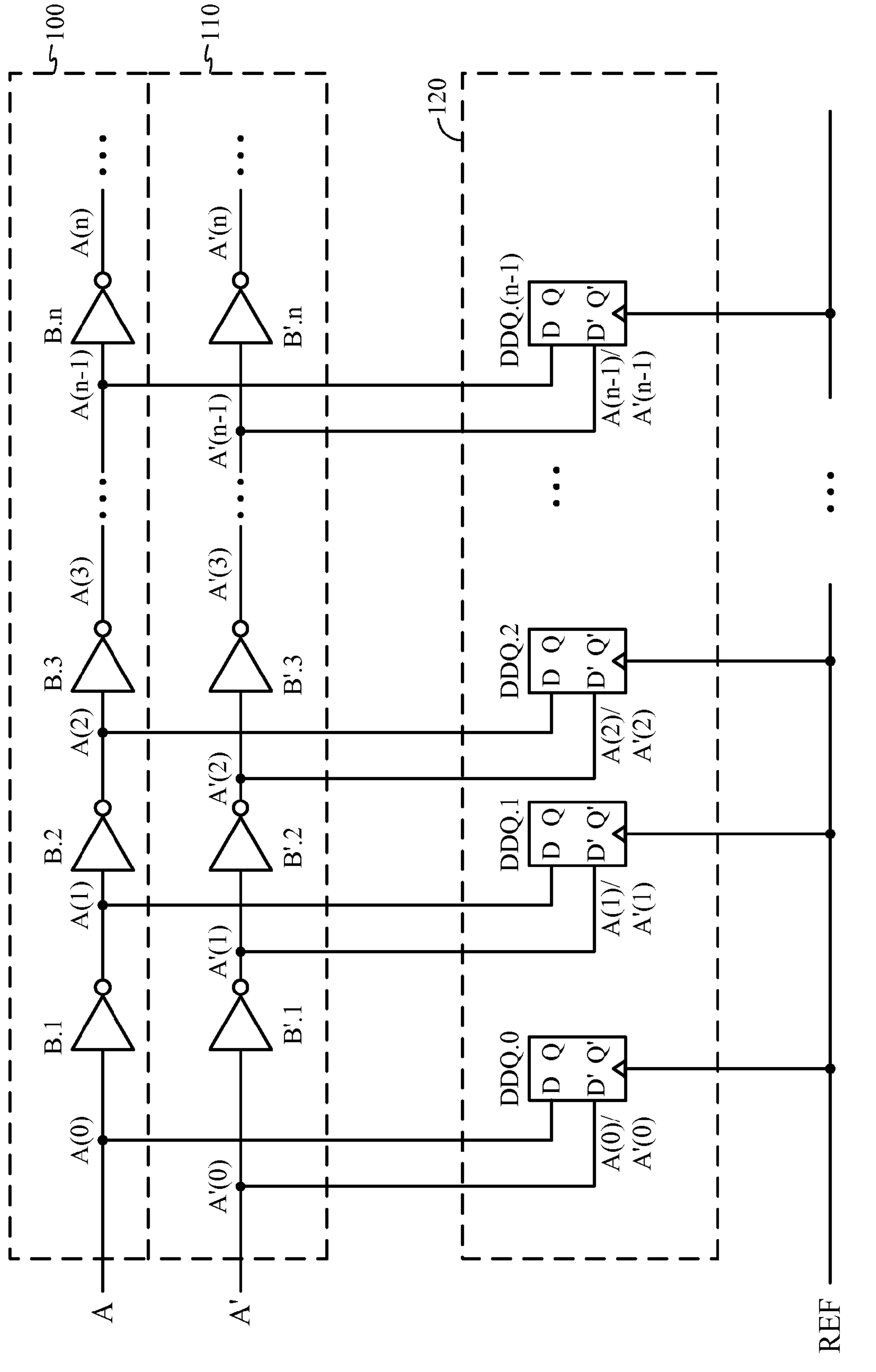
FIG. 1 PRIOR ART
FIG. 1 depicts an implementation of a portion of a prior art TDC.

FIG. 1 depicts an implementation of a portion of a prior art TDC. In FIG. 1, inverting buffers B.n, each having a delay $T_D$, form a delay line 100. The delay line 100 generates progressively delayed versions A(n) of an original single-ended signal A, wherein n is an index ranging from zero (no delay) up to the maximum delay of the delay line 100.

Also shown in FIG. 1 is a signal A' complementary to A. The signals A and A' are logical inverses of each other, and allow for differential signal processing in the TDC datapath. Advantages of differential processing over single-ended processing are well-known in the art, and include, for example, better rejection of common-mode noise at the inputs and outputs of the flip-flops. A' is provided with its own delay line 110, which generates progressively delayed versions A'(n) of A' using inverting buffers B'.n.

FIG. 1 further depicts a plurality of differential D-Q flip-flops 120. Each D-Q flip-flop is designed to sample the voltage (or current) difference at its differential input D/D' on the rising edge of a signal REF. Note in this specification and in the claims, the nomenclature X/Y denotes a differential signal composed of single-ended signals X and Y. Each flip-flop provides a logical value of the sampled voltage difference at its differential input to the differential flip-flop output Q/Q' at a subsequent time. For example, in an embodiment, if the single-ended input D has a voltage level higher than the voltage level of single-ended input D', then the differential output Q/Q' may generate a level of HIGH at a subsequent time, and vice versa. In this specification, a logical level of HIGH will be associated with a positive differential input signal D/D' for ease of description. One of ordinary skill in the art will realize that the discussion applies also to the reverse convention.

One of ordinary skill in the art will also realize that alternative TDC implementations may employ differential sampling mechanisms other than D-Q flip-flops. The techniques of the present disclosure may be readily applied to such alternative implementations.

In FIG. 1, the input D/D' to each flip-flop DQ.n is coupled to a corresponding differential input A(n)/A'(n) tapped from the delay lines 100 and 110. It is seen that collectively, the flip-flops DQ.n simultaneously sample the progressively delayed versions A(n)/A'(n) of the differential signal A/A' on the rising edge of REF. By coupling the plurality of flip-flop outputs Q/Q' to a decoder (not shown), the relative timing between the rising edge of REF and logical transitions in the signal A/A' may be determined. The TDC may output a discretized representation (not shown) of the relative timing thus measured.

Figure 2:
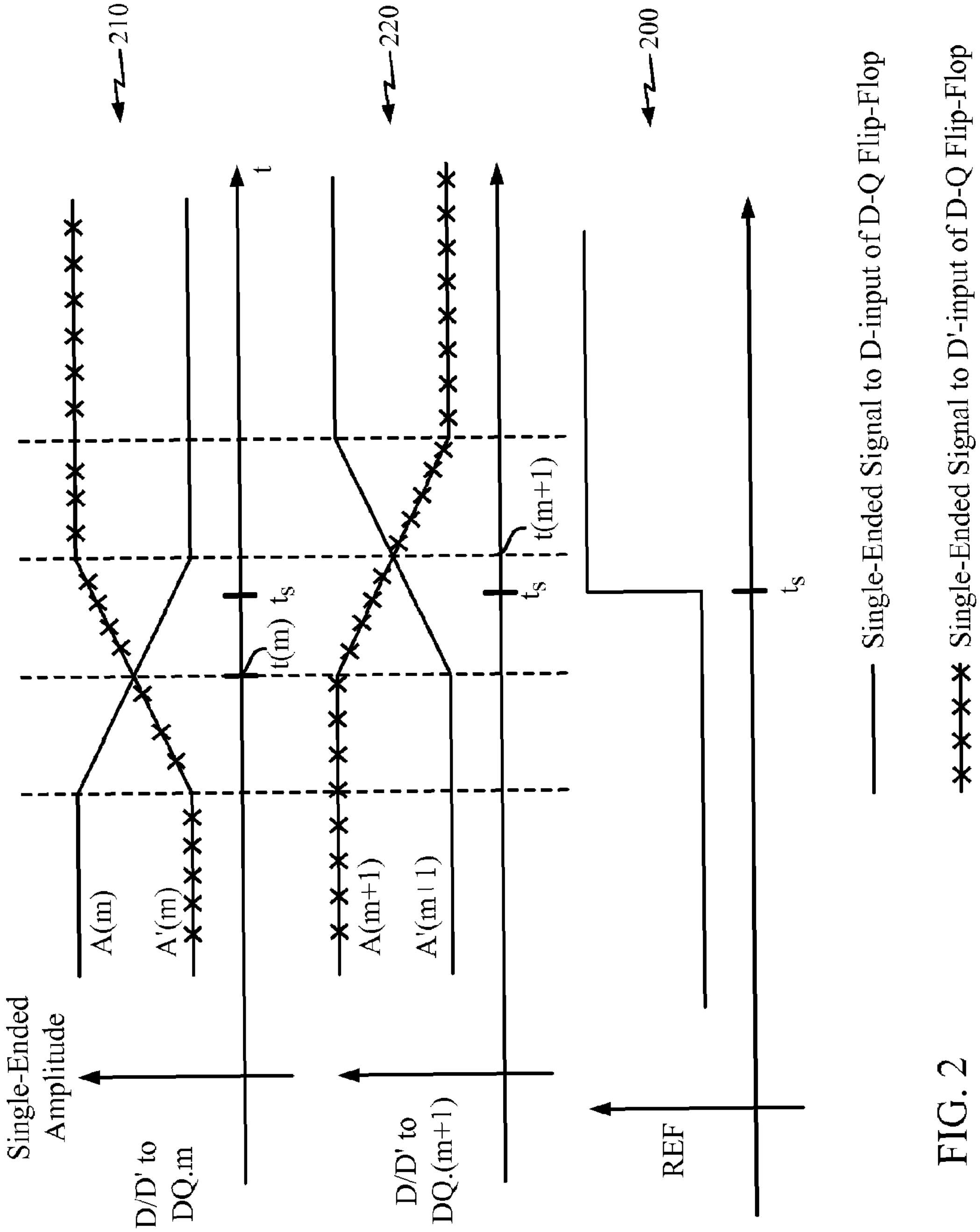
FIG. 2 illustrates an example of the timing of the signals depicted in FIG. 1.

FIG. 2 illustrates an example of the timing of the signals depicted in FIG. 1. In FIG. 2, plot 200 shows a rising edge of the signal REF at time $t_s$. Plot 210 shows a differential signal A(m)/A'(m) coupled to the input D/D' of flip-flop DQ.m, wherein m is the index to the specific instance of the signals depicted. Plot 220 shows the differential signal A(m+1)/A'(m+1) coupled to the input D/D' of flip-flop DQ.(m+1). DQ.(m+1) is the flip-flop that immediately follows the flip-flop DQ.m in the flip-flops 120 of FIG. 1. Due to the inversion introduced by buffers B.m and B'.m, comparisons between A(m)/A'(m) and A(m+1)/A'(m+1) should account for the difference in polarity between the two differential signals. Note in alternative embodiments, such signal inversion may not be present if, e.g., the signals A(n)/A'(n) from delay lines 100 and 110 are alternated between the inputs D/D' to successive flip-flops of FIG. 1. Such embodiments are contemplated to be within the scope of the present disclosure.

In FIG. 2, it is seen that the flip-flop DQ.m samples a logical LOW on the rising edge of REF at time $t_s$, while flip-flop DQ(m+1) also samples a logical LOW at $t_s$. Due to the signal inversion previously described, the two consecutive LOW's sampled by flip-flops DQ.m and DQ.(m+1) indicate that a logical transition occurs in the signal A during a time interval from m $T_D$ to (m+1) $T_D$ prior to the rising edge of REF. Note that because the resolution of the prior art TDC in FIG. 1 is limited to a single inverter delay $T_D$, the TDC is unable to determine the timing of the logical transition to an accuracy better than $\pm T_D/2$.

The resolution of the TDC in FIG. 1 may alternatively be understood with reference to the difference between the zero-crossing times of consecutively delayed versions of the original signal A/A'. A zero-crossing time represents the time at which a differential signal transitions from logical HIGH to logical LOW, or vice versa. In FIG. 2, time instants t(m) and t(m+1) reflect the zero-crossing times for differential signals A(m)/A'(m) and A(m+1)/A'(m+1), respectively. The timing resolution of the TDC may be computed as t(m+1)-t(m), which corresponds to the delay $T_D$ of a single delay buffer. To improve the resolution of the TDC, it would be desirable to decrease the difference between consecutive zero-crossing times available in the TDC.

Figure 3:
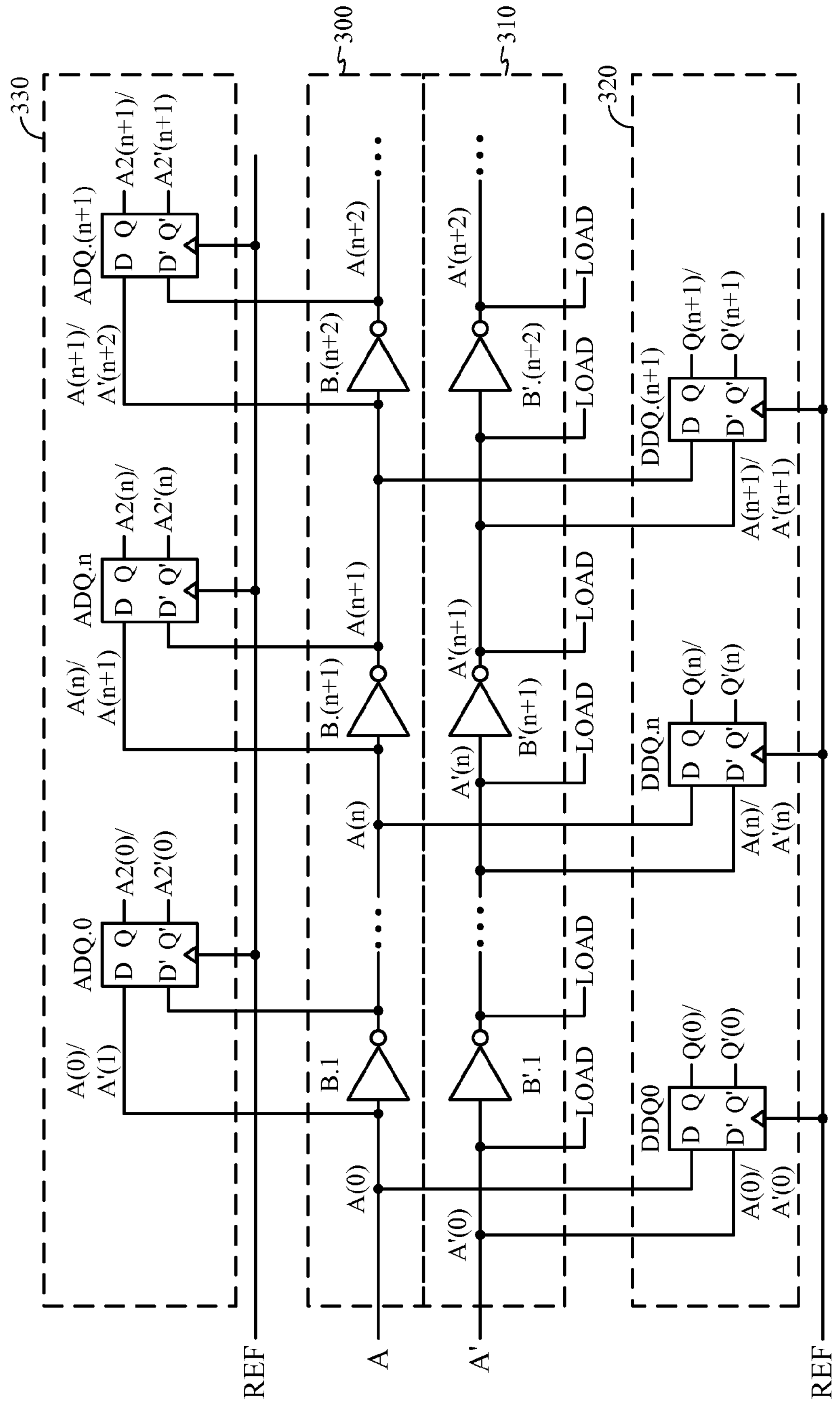
FIG. 3 depicts an embodiment according to the present disclosure for achieving sub-inverter delay resolution.

According to the present disclosure, sub-inverter delay resolution may be achieved by utilizing an alternative TDC architecture, such as depicted in FIG. 3.

In FIG. 3, a set 330 of "interpolating" flip-flops ADQ.n is provided in addition to the set 320 of D-Q flip-flops DQ.n. Each interpolating flip-flop ADQ.n samples a differential input D/D' to produce a differential output Q/Q'. The D input to each ADQ.n is coupled to the signal A(n) generated by delay line 300, while the D' input is coupled to the signal A(n+1) generated by delay line 300. The D and D' inputs to ADQ.n are seen to be inverted versions of each other, spaced one unit delay apart, e.g., one inverter delay. In the embodiment shown in FIG. 3, instances of a dummy load "LOAD" are provided to the delay line 310 to balance the loading on delay line 310 with the loading on delay line 300.

Figure 4:
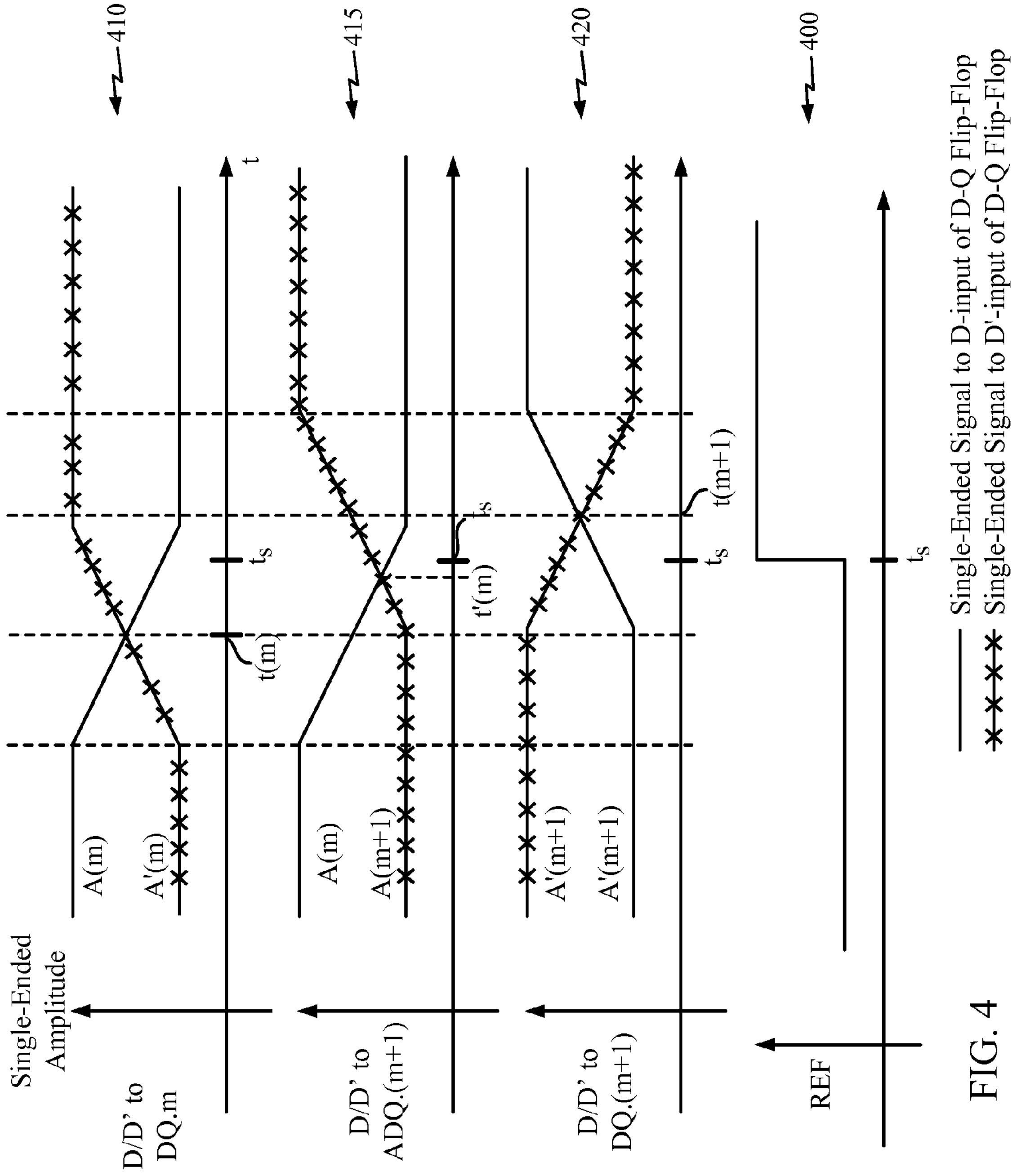
FIG. 4 illustrates an example of the timing of the differential input signal coupled to an interpolating flip-flop ADQ.m, in comparison with the timing of the differential input signals coupled to flip-flops DQ.m and DQ.(m+1).

FIG. 4 illustrates an example of the timing of the differential input signal coupled to a single flip-flop ADQ.m, in comparison with the timing of the differential input signals coupled to DQ.m and DQ.(m+1). In FIG. 4, plot 400 shows the same reference signal REF as shown in FIG. 2. Plots 410 and 420 show differential signals A(m)/A'(m) and A(m+1)/A'(m+1) coupled to the inputs of DQ.m and DQ.(m+1), respectively. Plot 415 shows the differential input signal A(m)/A(m+1) coupled to the inputs of ADQ.m.

In plots 410 and 420, the zero-crossing times are shown to be t(m) and t(m+1), respectively, similar to plots 210 and 220 in FIG. 2. In plot 415, however, the zero-crossing time for A(m)/A(m+1) is shown to be t'(m), which lies between t(m) and t(m+1). The scheme depicted effectively presents to ADQ.m an "interpolated" version of signal A/A' that has a delay greater than m $T_D$ but less than (m+1) $T_D$. Assuming equal rise and fall times for all signals, such delay will be approximately halfway between m $T_D$ and (m+1) $T_D$. By providing a plurality 330 of flip-flops ADQ.n as shown in FIG. 3, the signal A may accordingly be sampled with a timing resolution less than the unit delay, e.g., the delay $T_D$ of a single inverter.

Note depending on the embodiment, the actual delay of an interpolated signal relative to the original signal may be more or less than halfway between m $T_D$ and (m+1) $T_D$. One of ordinary skill in the art will realize that factors affecting the actual delay of the interpolated signal may include imbalance in the rise and fall times of the buffers due to, e.g., device mismatches and/or process variations. In an embodiment, variations in the level of TDC sampling due to imbalance in rise and fall times may be factored into the TDC measurement by, e.g., monitoring the rise and fall times and cancelling out the expected inaccuracy from the final measurement.

One of ordinary skill in the art will realize that various modifications may be made to the embodiment shown in FIG. 3, while still employing the techniques of the present disclosure. In an embodiment, to compensate for the inverting characteristic of the buffers B.n, the differential inputs to the flip-flops DQ.n may be successively flipped in polarity.

One of ordinary skill in the art will also realize that in alternative embodiments, non-inverting buffers may be employed in place of the inverting buffers B.n shown in FIGS. 1 and 3. In this case, the input D/D' to an interpolating D-Q flip-flop ADQ.n may be coupled to signals A(n)/A'(n+1), wherein A(n) is tapped from a first delay line corresponding to the original signal A, and A'(n+1) is tapped from a second delay line corresponding to the complementary signal A'. These and other embodiments are contemplated to be within the scope of the present disclosure.

Note the zero-crossing times described are merely chosen to illustrate the behavior of the sampling mechanism near the TDC quantization boundaries. One of ordinary skill in the art will realize that the zero-crossing times are mentioned for illustration purposes only, and that a typical differential input signal A may generally remain constant, without transitioning to another level, over an arbitrary period of time.

Figure 5:
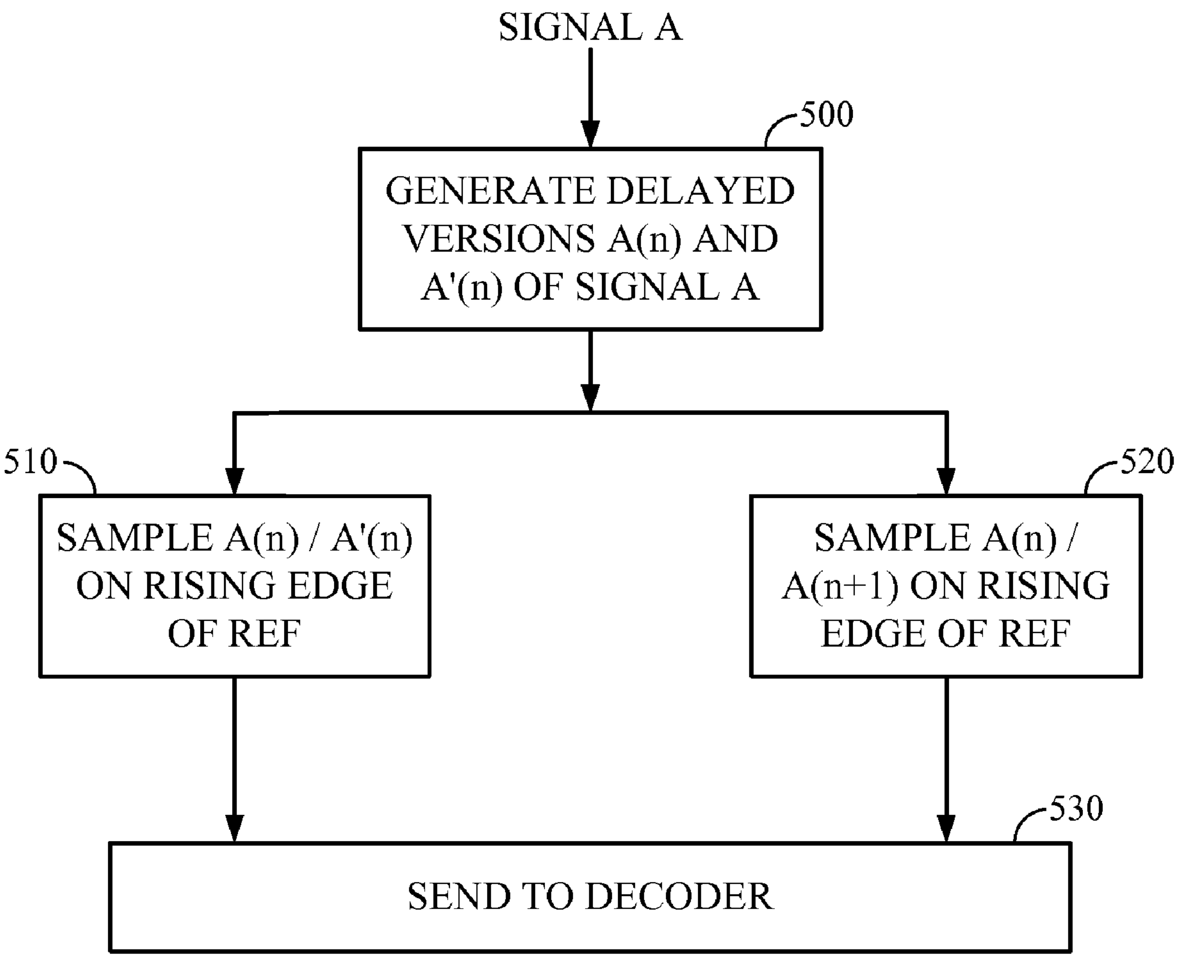
FIG. 5 depicts the steps according to a method of the present disclosure.

FIG. 5 depicts the steps according to a method of the present disclosure. In FIG. 5, delayed versions A(n) and A'(n) of a signal A are generated at step 500. At step 510, A(n)/A'(n) is sampled on the rising edge of REF. At step 520, A(n)/A(n+1) is also sampled on the rising edge of REF. At step 530, the samples are provided to a decoder for further processing. One of ordinary skill in the art will realize that the steps depicted in FIG. 5 are for illustration purposes only, and are not meant to limit the scope of the present disclosure to any particular steps shown.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The instructions or code associated with a computer-readable medium of the computer program product may be executed by a computer, e.g., by one or more processors, such as one or more digital signal processors (DSPs), general purpose microprocessors, ASICs, FPGAs, or other equivalent integrated or discrete logic circuitry.

In this specification and in the claims, it will be understood that when an element is referred to as being "connected to" or "coupled to" another element, it can be directly connected or coupled to the other element or intervening elements may be present. In contract, when an element is referred to as being "directly connected to" or "directly coupled to" another element, there are no intervening elements present.

A number of aspects and examples have been described. However, various modifications to these examples are possible, and the principles presented herein may be applied to other aspects as well. These and other aspects are within the scope of the following claims.

The invention claimed is:

1. A time-to-digital converter (TDC) comprising:

a delay line for generating at least one delayed version A(m) of a signal A, wherein A(m) is delayed relative to A by m delay units; and a sampling mechanism for sampling a difference between A(m) and a signal B[A(m)] at a time instant, wherein B[A(m)] is delayed relative to A by at least one delay unit;

the sampling mechanism is a differential D-Q flip-flop;

the signal A(m) is coupled to a D input of the D-Q flip-flop;

the signal B is coupled to a D' input of the D-Q flip-flop; and the flip-flop samples a voltage polarity of the differential input D/D'.

2. The TDC of claim 1, the signal B[A(m)] being a signal A(m+1), wherein A(m+1) is delayed relative to A by m+1 delay units.

3. The TDC of claim 2, each delay unit corresponding to the delay of a unit buffer.

4. The TDC of claim 3, the unit buffer being a single inverter.

5. A time-to-digital converter (TDC) comprising:

a delay line for generating at least one delayed version A(m) of a signal A, wherein A(m) is delayed relative to A by m delay units; and a sampling mechanism for sampling a difference between A(m) and a signal B[A(m)] at a time instant, wherein:

B[A(m)] is delayed relative to A by at least one delay unit;

the sampling mechanism is a differential D-Q flip-flop;

the signal A(m) is coupled to a D input of the D-Q flip-flop;

the signal B is coupled to a D' input of the D-Q flip-flop;

the delay line further generating a plurality of delayed versions A(n) of signal A, the sampling mechanism further sampling a difference between each of the signals A(n) and a corresponding signal B[A(n)], wherein each B[A(n)] is delayed relative to the corresponding A(n) by at least one delay unit.

6. The TDC of claim 5, further comprising a complementary delay line for generating a plurality of delayed versions A'(n) of a signal A' complementary to A, the TDC further comprising a plurality of differential D-Q flip-flops for sampling the difference between each signal A(n) and corresponding signal A'(n).

7. The TDC of claim 6, the complementary delay line coupled to at least one load for balancing the loading of the delay line with the loading of the complementary delay line.

8. A method for converting a time interval to a digital representation, the method comprising:

generating at least one delayed version A(m) of a signal A, wherein A(m) is delayed relative to A by m delay units; and sampling a difference between A(m) and a signal B[A(m)] at a time instant, wherein;

B[A(m)] is delayed relative to A by at least one delay unit;

the sampling is performed by a differential D-Q flip-flop;

the signal A(m) is coupled to a D input of the D-Q flip-flop;

the signal B is coupled to a D' input of the D-Q flip-flop; and the flip-flop samples a voltage polarity of the differential input D/D'.

9. The method of claim 8, the signal B[A(m)] being a signal A(m+1), wherein A(m+1) is delayed relative to A by m+1 delay units.

10. The method of claim 9, each delay unit corresponding to the delay of a unit buffer.

11. The method of claim 10, the unit buffer being a single inverter.

12. A method for converting a time interval to a digital representation, the method comprising:

generating at least one delayed version A(m) of a signal A, wherein A(m) is delayed relative to A by m delay units;

sampling a difference between A(m) and a signal B[A(m)] at a time instant, wherein:

B[A(m)] is delayed relative to A by at least one delay unit;

the sampling is performed by a differential D-Q flip-flop;

the signal A(n) is coupled to a D input of the D-Q flip-flop; and the signal B is coupled to a D' input of the D-Q flip-flop; and generating a plurality of delayed versions A(n) of signal A; and sampling a difference between each of the signals A(n) and a corresponding signal B[A(n)], wherein each B[A(n)] is delayed relative to the corresponding A(n) by at least one delay unit.

13. The method of claim 12, further comprising generating a plurality of delayed versions A'(n) of a signal A' complementary to A, the method further comprising sampling the difference between each signal A(n) and a corresponding signal A'(n).

14. The method of claim 13, further comprising coupling at least one load to a delay line for generating the signals A'(n) to balance said delay line with a delay line for generating signals A(n).

15. A time-to-digital converter (TDC) comprising:

means for generating at least one delayed version A(m) of a signal A, wherein A(m) is delayed relative to A by m delay units; and means for sampling a difference between A(m) and a signal B[A(m)] at a time instant, wherein B[A(m)] is delayed relative to A by at least one delay unit, comprising:

means for causing the sampling to be performed by a differential D-Q flip-flop;

means for coupling the signal A(n) to a D input of the flip-flop;

means for coupling the signal B to a D' input of the D-Q flip-flop; and means for generating a plurality of delayed versions A(n) of signal A, wherein each B[A(n)] is delayed relative to the corresponding A(n) by at least one delay unit.

16. The TDC of claim 15, the signal B[A(m)] being a signal A(m+1), wherein A(m+1) is delayed relative to A by m+1 delay units.

17. The TDC of claim 16, each delay unit corresponding to the delay of a unit buffer.

18. The TDC of claim 17, the unit buffer being a single inverter.

19. A computer-readable medium encoded with computer-executable instructions, wherein execution of the computer-executable instructions is for:

causing a computer to generate at least one delayed version A(m) of a signal A, wherein A(m) is delayed relative to A by m delay units; and causing a computer to sample a difference between A(m) and a signal B[A(m)] at a time instant, wherein B[A(m)] is delayed relative to A by at least one delay unit;

causing the sampling to be performed by a differential D-Q flip-flop;

coupling the signal A(n) to a D input of the flip-flop;

coupling the signal B to a D' input of the D-Q flip-flop; and generating a plurality of delayed versions A(n) of signal A, wherein each B[A(n)] is delayed relative to the corresponding A(n) by at least one delay unit.

20. The computer-readable medium of claim 19, the signal B[A(m)] being a signal A(m+1), the computer-readable medium further encoded with computer-executable instructions for causing A(m+1) to be delayed relative to A by m+1 delay units.

21. The computer-readable medium of claim 20, each delay unit corresponding to the delay of a unit buffer.

22. A time-to-digital converter (TDC), comprising:

means for generating at least one delayed version A(m) of a signal A, wherein A(m) is delayed relative to A by m delay units;

means for sampling a difference between A(m) and a signal B[A(m)] at a time instant, comprising:

means for causing the sampling to be performed by a differential D-Q flip-flop;

means for coupling the signal A(n) to a D input of the flip-flop;

means for coupling the signal B to a D' input of the D-Q flip-flop; and means for generating a plurality of delayed versions A(n) of signal A, wherein each B[A(n)] is delayed relative to the corresponding A(n) by at least one delay unit; and means for generating a plurality of delayed versions A(n) of signal A; and means for sampling a difference between each of the signals A(n) and a corresponding signal B[A(n)], wherein each B[A(n)] is delayed relative to the corresponding A(n) by at least one delay unit.

23. The TDC of claim 22, further comprising:

means for generating a plurality of delayed versions A'(n) of a signal A' complementary to A; and means for sampling the difference between each signal A(n) and a corresponding signal A'(n).

24. The TDC of claim 23, further comprising:

means for coupling at least one load to a delay line for generating the signals A'(n) to balance said delay line with a delay line for generating signals A(n).

25. A tangible computer-readable storage medium having stored thereon processor- executable software instructions configured to cause a processor to perform steps comprising:

generating at least one delayed version A(m) of a signal A, wherein A(m) is delayed relative to A by m delay units;

sampling a difference between A(m) and a signal B[A(m)] at a time instant, wherein:

B[A(m)] is delayed relative to A by at least one delay unit;

the sampling is performed by a differential D-Q flip-flop;

the signal A(n) is coupled to a D input of the D-Q flip-flop; and the signal B is coupled to a D' input of the D-Q flip-flop; and generating a plurality of delayed versions A(n) of signal A; and sampling a difference between each of the signals A(n) and a corresponding signal B[A(n)], wherein each B[A(n)] is delayed relative to the corresponding A(n) by at least one delay unit.

26. The tangible computer-readable storage medium of claim 25, wherein the tangible storage medium has processor-executable software instructions configured to cause the mobile device processor to perform further steps comprising:

generating a plurality of delayed versions A'(n) of a signal A' complementary to A; and sampling the difference between each signal A(n) and a corresponding signal A'(n).

27. The tangible computer-readable storage medium of claim 26, wherein the tangible storage medium has processor-executable software instructions configured to cause the mobile device processor to perform further steps comprising:

coupling at least one load to a delay line for generating the signals A'(n) to balance said delay line with a delay line for generating signals A(n).

* * * * *